(12) United States Patent
Choi et al.

(10) Patent No.: US 10,903,282 B2
(45) Date of Patent: Jan. 26, 2021

(54) ORGANIC LIGHT EMITTING DISPLAY DEVICE

(71) Applicant: LG DISPLAY CO., LTD., Seoul (KR)

(72) Inventors: Yong-Hoon Choi, Paju-si (KR); So-Young Jo, Paju-si (KR); Min-Geun Choi, Paju-si (KR); Hee-Jung Yang, Paju-si (KR); Soo-Kang Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/139,810

(22) Filed: Sep. 24, 2018

(65) Prior Publication Data
US 2019/0103442 A1    Apr. 4, 2019

(30) Foreign Application Priority Data

Sep. 29, 2017  (KR) .................. 10-2017-0127124
Sep. 6, 2018   (KR) .................. 10-2018-0106421

(51) Int. Cl.
| | |
|---|---|
| *H01L 27/32* | (2006.01) |
| *H01L 51/52* | (2006.01) |
| *H01L 51/50* | (2006.01) |
| *H01L 27/12* | (2006.01) |

(52) U.S. Cl.
CPC ........ *H01L 27/322* (2013.01); *H01L 51/5012* (2013.01); *H01L 51/5206* (2013.01); *H01L 51/5209* (2013.01); *H01L 51/5221* (2013.01); *H01L 51/5225* (2013.01); *H01L 51/5275* (2013.01); *H01L 27/124* (2013.01); *H01L 27/3213* (2013.01)

(58) Field of Classification Search
CPC .............. H01L 27/322; H01L 51/5275; H01L 51/5012; H01L 27/3213; H01L 27/124; H01L 51/5271; H01L 51/5284; H01L 51/5225; H01L 51/5209
See application file for complete search history.

(56) References Cited

U.S. PATENT DOCUMENTS

| | | |
|---|---|---|
| 2017/0110522 A1 | 4/2017 | Lee et al. |
| 2017/0125738 A1 | 5/2017 | Kim et al. |
| 2017/0162632 A1 | 6/2017 | Kim et al. |
| 2019/0067383 A1* | 2/2019 | Jo ................. H01L 27/3262 |

FOREIGN PATENT DOCUMENTS

| | | |
|---|---|---|
| CN | 105742326 A | 7/2016 |
| CN | 106601769 A | 4/2017 |
| CN | 106972041 A | 7/2017 |
| CN | 107039598 A | 8/2017 |
| CN | 107068891 A | 8/2017 |
| CN | 107134543 A | 9/2017 |
| CN | 109427859 A | 3/2019 |
| KR | 10-2015-0060200 A | 6/2015 |

* cited by examiner

*Primary Examiner* — Thanh Y. Tran
(74) *Attorney, Agent, or Firm* — Birch, Stewart, Kolasch & Birch LLP

(57) ABSTRACT

An organic light emitting display device includes a substrate including a white pixel region, a blue color filter pattern in a first region of the white pixel region, an overcoat layer covering the blue color filer pattern and including a microlens, a first electrode on the overcoat layer, an organic emitting layer covering the first electrode, and a second electrode covering the organic emitting layer.

20 Claims, 12 Drawing Sheets

ORGANIC LIGHT EMITTING DISPLAY DEVICE

CROSS-REFERENCE TO RELATED APPLICATIONS

This application claims priority to and the benefit of Korean Patent Application No. 10-2017-0127124 filed in the Republic of Korea on Sep. 29, 2017, and Korean Patent Application No. 10-2018-0106421 filed on Sep. 6, 2018, all of which are hereby incorporated by reference in their entirety into the present application.

BACKGROUND OF THE INVENTION

Field of the Invention

Embodiments of the invention relate to an organic light emitting display device, and more particularly, to an organic light emitting display device having improved light out-coupling efficiency and improved color temperature.

Discussion of the Related Art

As information technology and mobile communication technology have been developed, a display device being capable of displaying a visual image has also been developed.

Flat panel display devices, such as a liquid crystal display (LCD), a plasma display panel (PDP) device, a field emission display (FED) device, an electroluminescence display device (ELD), an organic light emitting display (OLED) device, and so on, are developed and used instead of a cathode ray tube because of advantages in weight, power consumption, and so on.

Among the flat panel display device, the OLED device as a self-emission type has excellent characteristics of thin profile and light weight without a backlight unit required in the LCD device. In addition, the OLED display device has advantages of viewing angle, contrast ratio, low power consumption, low-voltage driving and fast response time. Moreover, since the OLED device includes the solid elements, the OLED device has advantages in an outer impact and an operation temperature range.

Further, since the fabricating process of the OLED device is very simple, the OLED device has a big advantage in the production cost.

The light loss of the light from an organic emitting layer is generated when the light passes through various elements in the device. For example, the light extraction of the light from the organic emitting layer can be about 20%.

Since the light extraction amount is proportional to the current applied to an organic light emitting diode, the brightness of the OLED device can be increased by increasing the current to the organic light emitting diode. However, it causes high power consumption and short lifespan.

To improve the light out-coupling (light extraction) of the OLED device, a micro-lens array (MLA) can be attached onto a substrate of the OLED device or a micro-lens can be formed in an overcoat layer of the OLED device.

However, in the OLED device including the MLA or the micro-lens, the color temperature is lowered such that the display quality of the OLED device can be degraded.

SUMMARY OF THE INVENTION

Accordingly, embodiments of the invention are directed to an OLED device that substantially obviates one or more of the problems due to limitations and disadvantages of the related art, and have other advantages.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

Embodiments of the present invention provide an organic light emitting display device that includes a substrate including a white pixel region; a blue color filter pattern in a first region of the white pixel region; an overcoat layer covering the blue color filer pattern and including a micro-lens; a first electrode on the overcoat layer; an organic emitting layer covering the first electrode; and a second electrode covering the organic emitting layer.

It is to be understood that both the foregoing general description and the following detailed description are examples and are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to embodiments of the invention, examples of which are illustrated in the accompanying drawings.

Figure 1:
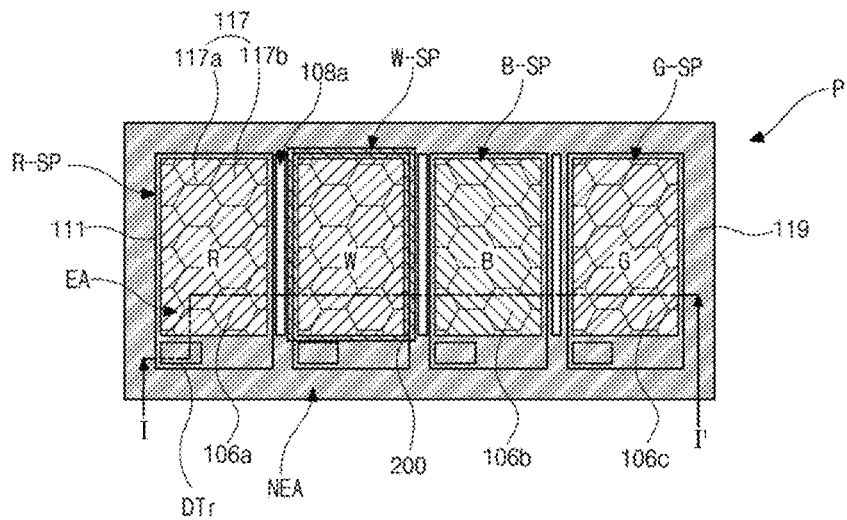
FIG. 1 is a schematic plan view of a pixel of an OLED device of a first embodiment of the present invention.
Figure 2:
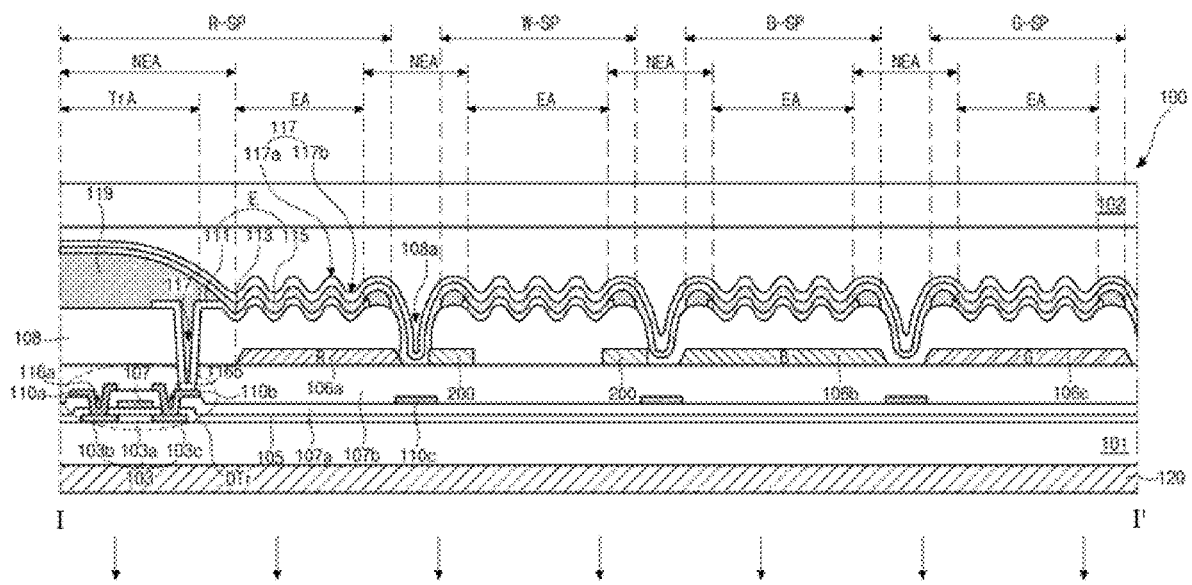
FIG. 2 is a schematic cross-sectional view taken along the line I-I' of FIG. 1.

FIG. 1 is a schematic plane view of a pixel of an OLED device of a first embodiment of the present invention. FIG. 2 is a schematic cross-sectional view taken along the line I-I' of FIG. 1. All the components of the OLED device according to all embodiments of the present invention are operatively coupled and configured.

As shown in FIG. 1, an OLED device 100 includes a plurality of pixels P. In the OLED device 100 (of FIG. 2), each or at least one of the pixels P includes a red pixel region R-SP, a white pixel region W-SP, a blue pixel region B-SP and a green pixel region G-SP. Each of the pixel regions R-SP, W-SP, B-SP and G-SP includes an emission area EA and a non-emission area NEA along an edge of the emission area EA. Namely, the non-emission area NEA is disposed at a periphery of the emission area EA. A bank 119 is disposed the non-emission area NEA. Namely, the bank 119 is disposed at a boundary of each of the pixel regions R-SP, W-SP, B-SP and G-SP.

In FIG. 1, the pixel regions R-SP, W-SP, B-SP and G-SP have the same width and are arranged along a direction. Alternatively, the pixel regions R-SP, W-SP, B-SP and G-SP can have different widths (areas).

A driving thin film transistor (TFT) DTr is formed in the non-emission area NEA of each pixel region R-SP, W-SP, B-SP and G-SP. A light emitting diode E (of FIG. 2), which includes a first electrode 111, an organic emitting layer 113 (of FIG. 2) and a second electrode 115 (of FIG. 2), is formed in the emission area EA of each pixel region R-SP, W-SP, B-SP and G-SP.

To emit (or display) red "R", white "W", blue "B" and green "G" lights in the pixel regions R-SP, W-SP, B-SP and G-SP, respectively, a red color filter 106a, a blue color filter 106b and a green color filter 106c are formed in the emission area EA of the red, blue and green pixel regions R-SP, B-SP and G-SP. There is no color filter in the white pixel region W-SP.

A plurality of micro-lens (micro-lens structure or micro-lens array) 117 are also formed in each pixel region R-SP, W-SP, B-SP and G-SP. A shape of the micro-lens 117 in each emission area EA can be same as each other. An external out-coupling efficiency of the organic emitting layer 113 is improved by the micro-lens 117.

The micro-lens 117 is formed by a surface of an overcoat layer 108 (of FIG. 2) and includes a plurality of concave portions 117b and a plurality of convex portions 117a adjacent to the concave portion 117b. Namely, the convex portion 117a and the concave portion 117b are alternately arranged with each other. In other words, the surface of the overcoat layer 108 is uneven to form the micro-lens 117.

At least one indent portion (recess portion) 108a is formed in the non-emission area NEA between adjacent two of the pixel regions R-SP, W-SP, B-SP and G-SP such that the light leakage, which is generated by reflection of the light on a metal layer, is prevented.

In FIG. 1, the indent portion 108a is formed in one direction (vertical direction). Alternatively, the indent portion 108a can be formed at an upper side and/or a lower side of each emission area EA in a plan view. In addition, the indent portion 108a can be formed at one of a right side or a left side of the emission area EA.

The light leakage between horizontally adjacent pixel regions can be greater than that between vertically adjacent pixel regions. Accordingly, in example, the indent portion 108a can be positioned between horizontally adjacent pixel regions.

In the OLED device 100 (of FIG. 2), a blue color filter pattern 200 is disposed in the non-emission area NEA of the white pixel region W-SP. The blue color filter pattern 200 can surround the emission area EA of the white pixel region W-SP.

The light leakage from the white pixel region W-SP is changed or converted into blue light by the blue color filter pattern 200 such that the color temperature of the OLED device 100 is improved. Accordingly, the OLED device 100 can provide high quality color.

FIG. 2 is a schematic cross-sectional view taken along the line I-I' of FIG. 1.

The OLED device 100 can be classified into a top-emission type and a bottom-emission type according to a transmitting direction of the light. In example, the bottom-emission type OLED device is illustrated.

Four pixels R-SP, W-SP, B-SP and G-SP arranged along a direction (horizontal direction) are defined as one pixel P. The four pixels are the red pixel region R-SP, the white pixel region W-SP, the blue pixel region B-SP and the green pixel region G-SP, respectively.

In each pixel region R-SP, W-SP, B-SP and G-SP, the emission area EA, where the emitting diode E is formed to serve as an image display area, and the non-emission area NEA surround the emission area EA are defined. In addition, a switching region TrA, where a driving thin film transistor (TFT) DTr is formed, is defined in the non-emission area NEA.

As shown in FIG. 2, in the OLED device 100, a substrate 101, where the driving TFT DTr and the emitting diode E are formed, is encapsulated by a protective film 102.

A semiconductor layer 103 is positioned in the switching region TrA of each pixel region R-SP, W-SP, B-SP and G-SP and on the substrate 101. The semiconductor layer 103 can be formed of poly-crystalline silicon. High-concentration impurity is doped on both ends of the semiconductor layer 103 such that an active region 103a as a channel is defined at a center and source and drain regions 103b and 103c are defined at both sides of the active region 103a.

Alternatively, the semiconductor layer 103 can be formed of an oxide semiconductor material. In this instance, a light-shielding layer can be formed under the semiconductor layer 103.

A buffer layer can be formed between the semiconductor layer 103 and the substrate 101.

A gate insulating layer 105 is disposed on the semiconductor layer 103.

A gate electrode 107, which corresponds to the active region 103a of the semiconductor layer 103, and a gate line, which extends along a direction, are disposed on the gate insulating layer 105.

In addition, a first interlayer insulating layer 107a is disposed on the gate electrode 107 and the gate line. In this instance, first and second semiconductor contact holes 116a and 116b, which respectively expose the source and drain regions 103b and 103c, are formed through the first interlayer insulating layer 107a and the gate insulating layer 105.

A source electrode 110a and a drain electrode 110b, which are spaced apart from each other and respectively contact the source region 103b and the drain region 103c through the first and second semiconductor contact holes 116a and 116b, are disposed on the first interlayer insulating layer 107a.

A second interlayer insulating layer 107b is disposed on the source electrode 110a, the drain electrode 110b and the exposed portion of the first interlayer insulating layer 107a between the source and drain electrodes 110a and 110b.

The source electrode 110a, the drain electrode 110b, the semiconductor layer 103 and the gate electrode 107 constitute the driving TFT DTr.

In addition, a data line 110c, which crosses the gate line to define each of the pixel regions R-SP, W-SP, B-SP and G-SP, is formed on the second interlayer insulating layer 107b. A switching TFT, which can have substantially the same structure as the driving TFT DTr and be connected to the driving TFT DTr, can be further disposed in each of the pixel regions R-SP, W-SP, B-SP and G-SP.

In FIG. 2, the driving TFT DTr includes the semiconductor layer 103, which is a poly-crystalline silicon semiconductor layer or an oxide semiconductor layer, and has a top-gate structure. Alternatively, the driving TFT DTr can include the semiconductor layer 103, which includes intrinsic amorphous silicon and impurity-doped amorphous silicon, and have a bottom-gate structure.

Color filters 106a, 106b and 106c, which respectively correspond to the emission areas EA of the red, blue and green pixel regions R-SP, B-SP and G-SP, are disposed on the second interlayer insulating layer 107b.

The white light from the organic emitting layer 113 is changed (or filtered) by the color filters 106a, 106b and 106c. A red color filter 106a, a blue color filter 106b and a green color filter 106c are respectively disposed in the emission areas EA of the red, blue and green pixel regions R-SP, B-SP and G-SP. The color filters 106a, 106b and 106c can extend into a portion of the non-emission area NEA of respective pixel region.

As mentioned above, there is no color filter in the emission area EA of the white pixel region W-SP, the white light from the organic emitting layer 113 passes without converting or filtering.

In the OLED device 100, red, white, blue and green colors are respectively provided from the pixel regions R-SP, W-SP, B-SP and G-SP such that high brightness full color image is provided.

In the OLED device 100, the blue color filter pattern 200 is disposed in the non-emission area NEA of the white pixel region W-SP. Due to the blue color filter pattern 200, the color temperature of the OLED device 100 is improved.

An overcoat layer 108 is disposed on the color filters 106a, 106b and 106c and the blue color filter pattern 200. A drain contact hole 117 exposing the drain electrode 110b is formed through the overcoat layer 108 and the second interlayer insulating layer 107b. In the emission area EA, the plurality of convex portions 117a and the plurality of concave portions 117b, which are alternately arranged with each other, are formed on a surface of the overcoat layer 108 to form the micro-lens 117.

The overcoat layer 108 is formed of an insulating material having a refractive index of about 1.5. For example, the overcoat layer 108 can be formed of an acryl-based resin, an epoxy-based resin, a phenol-based resin, a polyamide-based resin, a polyimide-based resin, a unsaturated-polyester-based resin, a polyphenylene-based resin, a polyphenylene-sulfide-based resin, a benzocyclobutene-based resin or photoresist, but it is not limited thereto.

Since the micro-lens structure 117 is provided at the surface of the overcoat layer 108, the light out-coupling efficiency of the OLED device 100 is improved.

At least one indent portion (recess portion) 108a is formed through the overcoat layer 108 in the non-emission area NEA between adjacent two of the pixel regions R-SP, W-SP, B-SP and G-SP.

A depth of the indent portion 108a can be smaller than a height of the overcoat layer 108 in the non-emission area NEA. Alternatively, the depth of the indent portion 108a can be equal to the height of the overcoat layer 108 such that the overcoat layer 107b can be exposed through the indent portion 108a. In addition, the depth of the indent portion 108a can be greater than the height of the overcoat layer 108 such that the indent portion 108a can extend into a portion of the second interlayer insulating layer 107b.

A first electrode 111, which is connected to the drain electrode 110b of the driving TFT DTr, is disposed on the overcoat layer 108. The first electrode 111 can be formed of a conductive material having a relatively high work function to serve as an anode.

For example, the first electrode 111 can be formed of a metal oxide material, e.g., indium-tin-oxide (ITO) or indium-zinc-oxide (IZO), a mixture of metal and oxide, e.g., ZnO:Al or SnO$_2$:Sb, or a conductive polymer, e.g., poly(3-methylthiophene), poly[3,4-(ethylene-1,2-dioxy)thiophene] (PEDT), polypyrrole, or polyaniline. In addition, the first electrode 111 can be formed of carbon nano tube (CNT), graphene or silver nano wire.

The first electrode 111 is separated in each of the pixel regions R-SP, W-SP, B-SP and G-SP. The bank 119 is disposed between adjacent first electrodes 111. Namely, the bank 119 is disposed at a boundary of each of the pixel regions R-SP, W-SP, B-SP and G-SP and covers an edge of the first electrode 111.

The bank 119 is disposed to overlap the overcoat layer 108 in the non-emission area NEA such that the indent portion 108a is exposed.

The organic emitting layer 113 is disposed on the first electrode 111. The organic emitting layer 113 can have a single-layered structure of an emitting material. Alternatively, to improve the emitting efficiency, the organic emitting layer 113 can have a multi-layered structure of a hole injection layer, a hole transporting layer, an emitting material layer, an electron transporting layer and an electron injection layer.

The second electrode 115 is disposed on the organic emitting layer 113 and over an entire surface of the substrate 101. The second electrode 115 can be formed of a conductive material having a relatively low work function to serve as a cathode. For example, the second electrode 115 can have a single-layered structure of an alloy from a first metal, e.g., Ag, and a second metal, e.g., Mg, or a multi-layered structure including the first metal layer and the second metal layer.

When the voltages are applied to the first and second electrodes 111 and 115, a hole from the first electrode 111 and an electron from the second electrode 115 are transferred into the organic emitting layer 113 to form an exciton. The exciton is transited from an excited state into a ground state such that the light is emitted from the emitting diode E.

The light from the emitting diode E passes through the first electrode 111 such that the OLED device 100 displays an image.

The concave portion 117b and the convex portion 117a on the surface of the overcoat layer 108 are reflected onto the first electrode 111, the organic layer 113 and the second electrode 115, which are sequentially stacked on the overcoat layer 108, such that the micro-lens 117 is provided.

The organic emitting layer 113 and the second electrode 115 are disposed in the non-emission area NEA as well as the emission area EA. Namely, the organic emitting layer 113 and the second electrode 115 are disposed in the indent portion 108a in the non-emission area NEA.

Accordingly, the light leakage from adjacent one of the pixel regions R-SP, W-SP, B-SP and G-SP is prevented or minimized.

The protection film 102 as a thin film is formed on or over the driving TFT DTr and the emitting diode E such that the OLED device 100 is encapsulated by the protection film 102.

The penetration of external oxygen and/or moisture into the OLED device 100 is blocked by the protection film 102. For example, the protection film 102 can include first and second inorganic insulating films and an organic insulating film therebetween. The anti-impact property of the inorganic insulating films can be compensated by the organic insulating film.

To block the penetration of external oxygen and/or moisture through a side surface of the organic insulating film, the upper side surface and the side surface of the organic insulating film can be completely covered by the second inorganic insulating film.

Accordingly, the penetration of external oxygen and/or moisture into the inner side of the OLED device 100 is prevented.

In addition, a polarization plate 120 can be disposed or attached on an outer side of the substrate 101 to prevent contrast ratio decrease by an ambient light reflection.

Namely, the polarization plate 120 is positioned in a light path from the organic emitting layer 113 when the OLED device 100 is driven such that the contrast ratio of the OLED device 100 is improved.

For example, the polarization plate 120 can be a circular polarization plate. The polarization plate 120 can include a retardation plate and a linear polarization plate. The retardation plate can be positioned between the substrate 101 and the linear polarization plate.

The retardation plate can be a quarter wave plate (¼λ plate, QWP). The linear polarization plate has a polarization axis, and the light is linearly-polarized along a direction of the polarization axis.

The ambient light reflection in the OLED device 100 is decreased by the polarization plate 120 such that the contrast ratio of the OLED device 100 is improved.

As mentioned above, since the OLED device 100 includes the micro-lens 117 having the convex portions 117a and the concave portions 117b, the light out-coupling efficiency is improved.

Namely, a part of the light from the organic emitting layer 113 is totally reflected between the organic emitting layer 113 and the second electrode 115 such that the light is trapped in the space between the organic emitting layer 113 and the second electrode 115. However, in the OLED device 100 of the present invention, the light is incident to the micro-lens 117 of the second electrode 115 in an angle being smaller than a critical angle of the total reflection such that the external emitting efficiency is increased by the multiple reflections. Accordingly, the light out-coupling efficiency of the OLED device 100 is improved.

In addition, the indent portion 108a is formed in the overcoat layer 108 in the non-emission area NEA between adjacent pixel regions R-SP, W-SP, B-SP and G-SP, the light leakage from adjacent pixel regions R-SP, W-SP, B-SP and G-SP is prevented or minimized.

In the OLED device including the micro-lens, the light from the organic emitting layer toward the substrate is reflected by the metal line, e.g., the data line 110c, over the substrate such that the light is incident to adjacent pixel region. Namely, the light leakage is generated.

However, in the OLED device 100 of the present invention, since the overcoat layer 108 includes the indent portion 108a and the second electrode 115 is disposed inside the indent portion 108a, the light leakage is prevented or minimized. Namely, even though the light from the organic emitting layer 113 is reflected by the metal line, the light is reflected again by the second electrode 115 in the indent portion 108a such that the light toward adjacent pixel region is prevented or minimized.

Generally, the chromaticity of the light source or the reference white color can be defined by a temperature of a closest region in the radiation curve instead of the coordinate in the 2 dimension color coordinate. It can be referred to as a correlated color temperature (CCT) or a color temperature.

The color temperature is used as a reference showing which color is closer to the white color. When the color of the display device is closer to the blue color, the color temperature is relatively high. When the color of the display device is closer to the yellow color, the color temperature is relatively low. The display device can provide high quality image (or color) with high color temperature.

To provide high quality image (color) in the display device using an emitting diode emitting white light, it is preferred that the color temperature of the white light is high.

On the other hand, the micro-lens 117 is provided in the emitting diode E by the overcoat layer 108 having an uneven surface such that the optical efficiency of the OLED device 100 is improved. However, the optical efficiency increase in the yellow-green light (red light and green light) is higher than that in the blue light.

Figure 3:
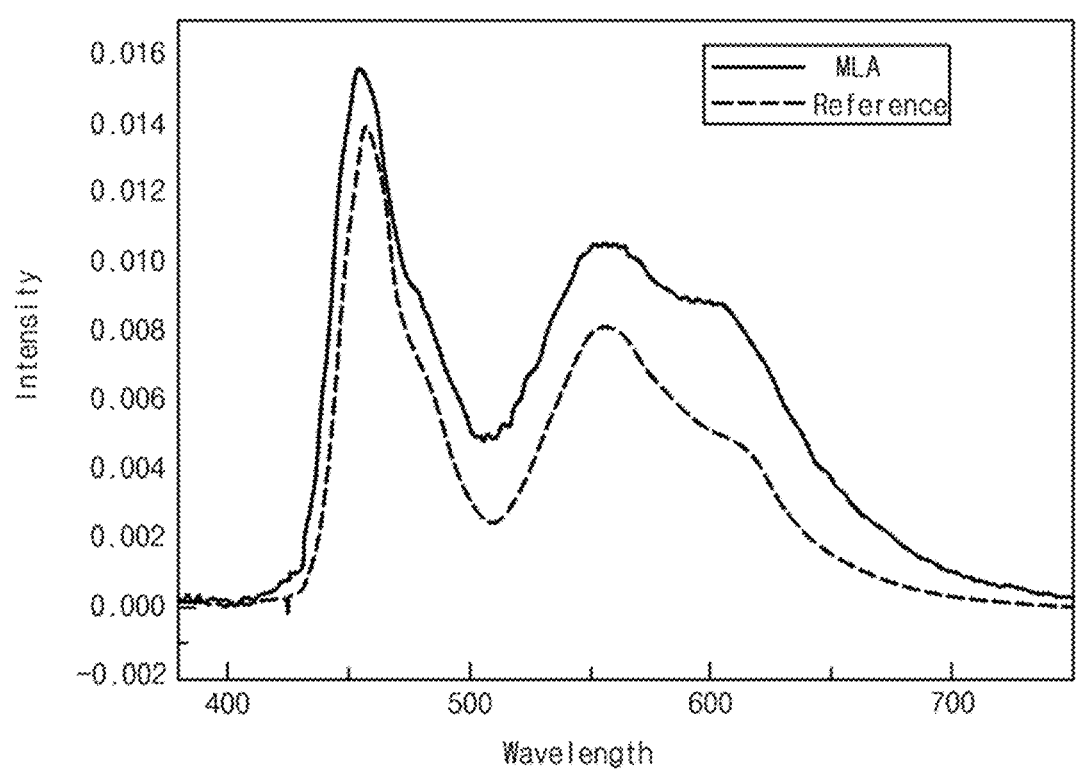
FIG. 3 is a graph showing a spectrum in an OLED device including a micro-lens according to an example of the present invention.

Namely, referring to FIG. 3, which is a graph showing a spectrum in an OLED device including a micro-lens, in comparison to the emitting diode "Ref" without the micro-lens, the light intensity, i.e., the brightness, of the emitting diode "MLA" with the micro-lens is increased. In this instance, the brightness increase in in the yellow-green light is higher than that in the blue light such that the color temperature in the white pixel region W-SP is decreased.

To compensate the decrease of the color temperature by the micro-lens, the blue component can be increased by driving the blue pixel region B-SP. However, since the efficiency of the blue pixel region B-SP is lower than that in each of the red and green pixel regions R-SP and G-SP, the lifespan of the emitting diode E and the efficiency of the display device are decreased.

In the OLED device 100 of the present invention, since the indent portion 108a is formed in a space between the white pixel region W-SP and adjacent pixel region, the light leakage in the white pixel region W-SP from adjacent pixel region is prevented. In addition, since the blue color filter pattern 200 is formed in the non-emission area NEA of the white pixel region W-SP, the light leakage from the white pixel region W-SP is converted to be bluish.

Namely, the color temperature decrease by the light leakage from the adjacent pixel region toward the white pixel region W-SP is prevented by the indent portion 108a, and the color temperature decrease by the micro-lens 117 is prevented by the indent portion 108a and the blue color filter pattern 200.

Further, since the driving of the blue pixel region W-SP is not required to compensate the color temperature decrease, the lifespan and the efficiency of the emitting diode E are not decreased.

Accordingly, the OLED device 100 provides the white color light having high color temperature, i.e., high quality color image, without disadvantages in the lifespan and the efficiency of the emitting diode E.

Figure 4:
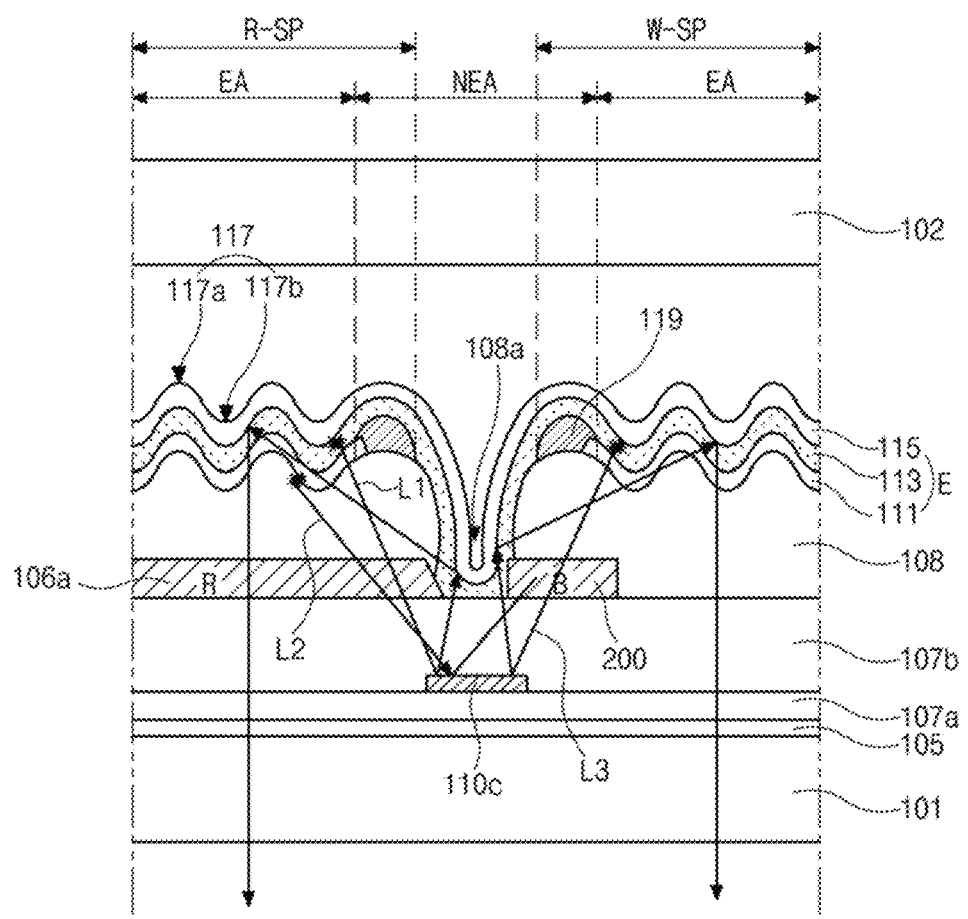
FIG. 4 is a view illustrating a light guiding path in the OLED device of the first embodiment of the present invention.

FIG. 4 is a view illustrating a light guiding path in the OLED device of the first embodiment of the present invention.

As shown in FIG. 4, the red pixel region R-SP and the white pixel region W-SP are adjacently arranged with the data line 110c therebetween. The red color filter 106a is disposed on the second interlayer insulating layer 107b in the emission area EA of the red pixel region R-SP, and the blue color filter pattern 200 is disposed on the second interlayer insulating layer 107b in the non-emission area NEA of the white pixel region W-SP.

The overcoat layer 108, which is disposed on the red color filter 106a and the blue color filter pattern 200, includes the micro-lens 117 at its surface in the emission area EA of each of the pixel regions R-SP and W-SP. Namely, the plurality of convex portions 117a and the plurality of concave portions 117b are formed on the surface of the overcoat layer 108. In addition, the indent portion 108a is provided in the overcoat layer 108 at the non-emission area NEA between the pixel regions R-SP and W-SP.

The blue color filter pattern 200, which is disposed in the non-emission area NEA of the white pixel region W-SP, is positioned between the indent portion 108a between the white pixel region W-SP and the red pixel region R-SP and the emission area EA of the white pixel region W-SP.

The first electrode 111 is separately disposed in each of the pixel regions R-SP and W-SP and on the overcoat layer 108. The organic emitting layer 113 and the second electrode 114 are sequentially disposed on the first electrode 111 such that the emitting diode E is provided.

The bank 119 is disposed between the first electrode 111 in the red pixel region R-SP and the first electrode 111 in the white pixel region W-SP and exposes the indent portion 108a. The organic emitting layer 113 and the second electrode 115 are disposed in the indent portion 108a.

The substrate 101 including the emitting diode E is encapsulated by the protective film 102.

The light from the organic emitting layer 113 in the red pixel region R-SP passes through the red color filter 106a and the substrate 101. A part of the light in the red pixel region R-SP is reflected by the data line 110c to be incident toward the white pixel region W-SP. The light "L1" toward the white pixel region W-SP is reflected again by the second electrode 115 in the indent portion 108a such that the light "L1" is incident toward the micro-lens 117 in the red pixel region R-SP. The light is extracted by the multiple reflections in the micro-lens 117.

Accordingly, the light leakage is prevented. In addition, since the light leakage is recycled in the red pixel region R-SP, the light extraction efficiency of the OLED device 100 is further improved.

In addition, since the leaked light "L2" from the red pixel region R-SP passes through the red color filter 106a and blocked by the blue color filter pattern 200, the leaked light "L2" toward the white pixel region W-SP is blocked. Accordingly, the decrease of the color temperature in the white pixel region W-SP by the leaked light "L2" from the red pixel region R-SP is prevented.

A part of the light from the organic emitting diode E in the white pixel region W-SP is reflected by the data line 110c toward adjacent pixel region, e.g., the red pixel region R-SP. The light "L3" toward the red pixel region R-SP is reflected again by the second electrode 115 in the indent portion 108a and is incident toward the micro-lens 117 in the white pixel region W-SP. The light is extracted by the multiple reflections in the micro-lens 117.

Accordingly, the light leakage is prevented. In addition, since the light leakage is recycled in the white pixel region W-SP, the light extraction efficiency of the OLED device 100 is further improved.

Moreover, since the recycled light in the white pixel region W-SP passes through the blue color filter pattern 200 in the non-emission area NEA in the white pixel region W-SP, the color temperature of the OLED device 100 is further improved.

As mentioned above, since the OLED device 100 includes the micro-lens 117, which is provided by the convex portion 117a and the concave portion 117b of the overcoat layer 108, the light extraction efficiency is improved.

In addition, since the indent portion 108a is disposed through the overcoat layer 108 at the non-emission area NEA between adjacent pixel regions, the light leakage from one pixel region toward adjacent pixel region is prevented or minimized and the light extraction efficiency is further improved.

Moreover, since the blue color filter pattern 200 is disposed in the non-emission area NEA of the white pixel region W-SP, the light leakage from adjacent pixel region is blocked. Furthermore, since the leaked light from the white pixel region W-SP is recycled to be bluish, the color temperature is improved.

Accordingly, the OLED device 100 provides high light extraction efficiency and high quality color image without disadvantages in the lifespan and the efficiency.

Figure 5:
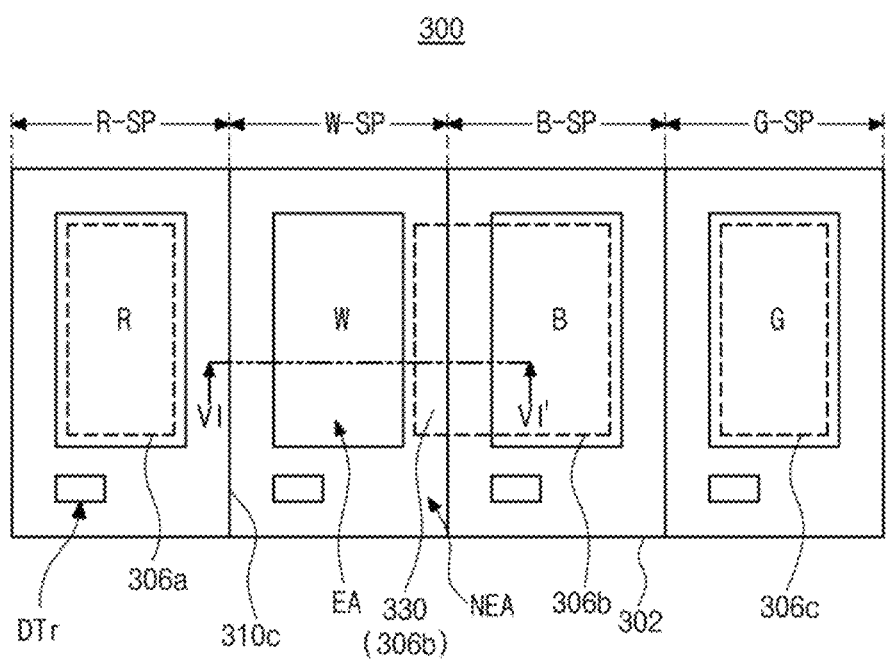
FIG. 5 is a schematic plan view of a pixel of an OLED device of a second embodiment of the present invention.
Figure 6:
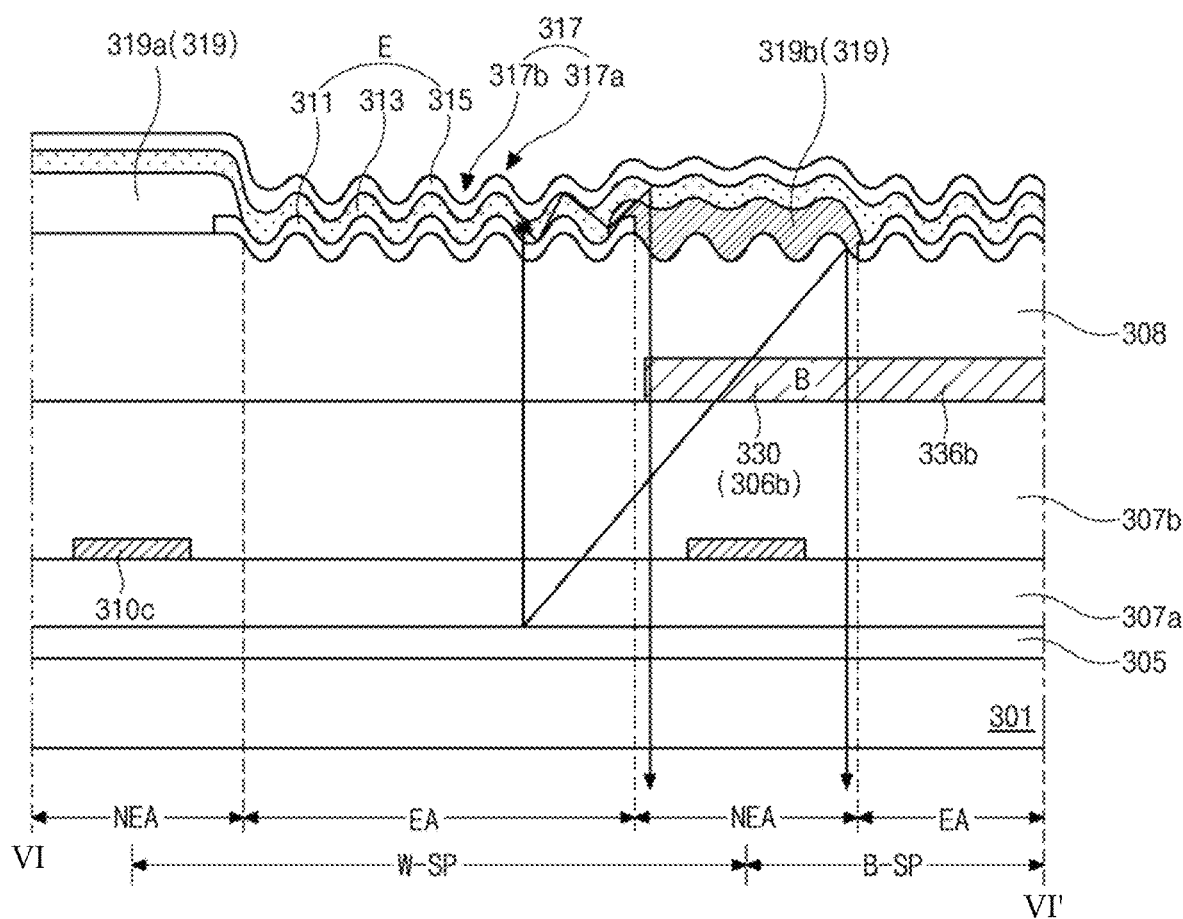
FIG. 6 is a schematic cross-sectional view taken along the line VI-VI' of FIG. 5.

FIG. 5 is a schematic plan view of a pixel of an OLED device 300 of a second embodiment of the present invention, and FIG. 6 is a schematic cross-sectional view taken along the line VI-VI' of FIG. 5.

As shown in FIGS. 5 and 6, in the OLED device 300 according to the second embodiment of the present invention, the pixel includes the red, white, blue and green pixel regions R-SP, W-SP, B-SP and G-SP arranged along a first direction (horizontal direction).

Each of the pixel regions R-SP, W-SP, B-SP and G-SP includes the non-emission area NEA, where the bank 319 is disposed, and the emission area EA surrounded by the non-emission area NEA. The emitting diode E, which includes the first electrode 311, the organic emitting layer 313 and the second electrode 315, is formed in the emission area EA.

The driving TFT DTr is disposed in the non-emission area NEA of each of the pixel regions R-SP, W-SP, B-SP and G-SP. For example, the driving TFT DTr includes the semiconductor layer, the gate electrode, the source electrode and the drain electrode.

Referring to FIG. 2 with FIG. 6, the semiconductor layer 103 is formed on the substrate 301, and the gate insulating layer 305 covering the semiconductor layer 103 is formed on an entire surface of the substrate 301. The gate electrode 107 overlapping the semiconductor layer 103 is formed on the gate insulating layer 105, and the first interlayer insulating layer 307a is formed on the gate electrode 107. The source electrode 110a and the drain electrode 110b, which are spaced apart from each other and respectively contact the both sides, i.e., the source region 103b and the drain region 103c, of the semiconductor layer 103, are formed on the first interlayer insulating layer 307a.

In addition, the gate line 302 extending along a first direction is formed on the gate insulating layer 305, and the data line 310c extending a second direction is formed on the first interlayer insulating layer 307a. The gate line 302 and the data line 310c cross each other to define each of the pixel regions R-SP, W-SP, B-SP and G-SP.

The second interlayer insulating layer 307b is formed on the data line 310c, and the red, blue and green color filters 306a, 306b and 306c are formed on the second interlayer insulating layer 307b. The red, blue and green color filters 306a, 306b and 306c correspond to the red, blue and green pixel regions R-SP, B-SP and G-SP, respectively. In addition, a blue color filter pattern 330 is formed on the second insulating layer 307*b* and in the non-emission area NEA between the white pixel region W-SP and the blue pixel region B-SP. In FIG. 6, the blue color filter pattern 330 extends from the blue color filter 306*b* toward the white pixel region W-SP along the first direction, i.e., a horizontal direction. Alternatively, the blue color filter pattern 330 can be spaced apart from the blue color filter 306*b*.

The red and green color filters 306*a* and 306*c* have the same area as the emission area EA of the red and green pixel regions R-SP and G-SP, respectively. On the other hand, since the blue color filter 306*b* extends to form the blue color filter pattern 330, an area of the blue color filter 306*b* including the blue color filter pattern 330 is greater than that of the emission area EA of the blue pixel region B-SP.

The second interlayer insulating layer 307*b* can be omitted. In this instance, the red, blue and green color filters 306*a*, 306*b* and 306*c* can be formed on the first interlayer insulating layer 307*a*, and the blue color filter pattern 330 can be formed to contact the data line 310*c*.

The overcoat layer 308 is formed to cover the red, blue and green color filters 306*a*, 306*b* and 306*c* and the blue color filter pattern 330. The overcoat layer 308 has an uneven surface. Namely, the plurality of concave portions 317*b* and the plurality of convex portions 317*a* are alternately provided at a surface of the overcoat layer 308 such that the overcoat layer 308 includes the micro-lens 317.

In the red and green pixel regions R-SP and G-SP, the micro-lens 317 has substantially the same area as the emission area EA. Namely, the red and green pixel regions R-SP and G-SP, the micro-lens 317 has substantially the same area as the red and green color filters 306*a* and 306*c*, respectively.

On the other hand, in the white and blue pixel regions W-SP and B-SP, the micro-lens 317 has an area being greater than the emission area EA. Namely, the micro-lens 317 in the white pixel region W-SP and/or the micro-lens 317 in the blue pixel region B-SP extends into the non-emission area NEA between the white pixel region W-SP and the blue pixel region B-SP.

For example, in the non-emission area NEA between the red and white pixel regions R-SP and W-SP and/or between the blue and green pixel regions B-SP and G-SP, the overcoat layer 308 has a flat top surface. In the non-emission area NEA between the white and blue pixel regions W-SP and B-SP, the overcoat layer 308 has an uneven surface to form the micro-lens 317.

The overcoat layer 308 is formed of an insulating material having a refractive index of about 1.5. For example, the overcoat layer 308 can be formed of an acryl-based resin, an epoxy-based resin, a phenol-based resin, a polyamide-based resin, a polyimide-based resin, a unsaturated-polyester-based resin, a polyphenylene-based resin, a polyphenylene-sulfide-based resin, a benzocyclobutene-based resin or photoresist, but it is not limited thereto.

The indent portion 108*a* (of FIG. 4) corresponding to the non-emission area NEA can be formed through the overcoat layer 308. In this instance, in the indent portion 108*a* between the blue pixel region B-Spa and the white pixel region W-SP, the second electrode 315 can be positioned between the blue color filter 306*b* in the blue pixel region B-SP and the blue color filter pattern 330 in the white pixel region W-SP.

The first electrode 311 is disposed on the overcoat layer 308 in each of the pixel regions R-SP, W-SP, B-SP and G-SP. The first electrode 311 is connected to the driving TFT DTr through the drain contact hole 117 (of FIG. 2). The first electrode 311 can be formed of a conductive material having a relatively high work function to serve as an anode.

The bank 319 is disposed in the non-emission area NEA and covers the edge of the first electrode 311. Namely, the bank 319 has an opening a portion of the first electrode 311, and the opening corresponds to each of the pixel regions R-SP, W-SP, B-SP and G-SP. In other words, the bank 319 surrounds the emission area EA and is disposed on the overcoat layer 308.

As mentioned above, the overcoat layer 308 has the flat top surface in the non-emission area NEA between the red pixel region R-SP and the white pixel region W-SP and the uneven top surface in the non-emission area NEA between the blue pixel region B-SP and the white pixel region W-SP.

Accordingly, the bank 319 includes a first bank 319*a*, which is disposed in the non-emission area NEA between the red pixel region R-SP and the white pixel region W-SP and has the flat top surface, and a second bank 319*b*, which is disposed in the non-emission area NEA between the blue pixel region B-SP and the white pixel region W-SP and has the uneven top surface. In FIG. 6, the uneven top surface of the second bank 319*b* has higher flatness than that of the overcoat layer 308. Namely, the uneven top surface of the second bank 319*b* has a difference in a shape from that of the overcoat layer 308. Alternatively, the uneven top surface of the second bank 319*b* can have the same shape as that of the overcoat layer 308.

The bank 319 has a flat top surface between the blue pixel region B-SP and the green pixel region G-SP.

The organic emitting layer 313 is formed to cover the bank 319 and the first electrode 311. Namely, the organic emitting layer 313 contacts the first electrode 313 in the emission area EA and the bank 319 in the non-emission area NEA.

The organic emitting layer 313 is formed on an entire surface of the display area including the red, white, blue and green pixel regions R-SP, W-SP, B-SP and G-SP.

The second electrode 315 is formed on the organic emitting layer 313. The second electrode 315 can be formed of a conductive material having a relatively low work function to serve as a cathode.

The first and second electrodes 311 and 315 facing each other and the organic emitting layer 313 therebetween constitute the emitting diode E.

In the emission are EA, the micro-lens 317 is provided on the first electrode 311, the organic emitting layer 313 and the second electrode 315 by the concave portions 317*b* and the convex portions 317*a* on the overcoat layer 308.

In addition, in the non-emission area EA between the white pixel region W-SP and the blue pixel region B-SP, the micro-lens 317 is provided on the organic emitting layer 313 and the second electrode 315 by the concave portions 317*b* and the convex portions 317*a* on the overcoat layer 308 and/or the second bank 319*b*.

Namely, the micro-lens 317 in the white pixel region W-SP corresponds to the emission area EA and the non-emission area NEA. For example, the micro-lens 317 in the green pixel region G-SP corresponds to the emission area EA except the non-emission area NEA.

The micro-lens 317 is provided in the non-emission area NEA between the white and blue pixel regions W-SP and B-SP to correspond to the blue color filter pattern 330.

In the OLED device of the present invention, since the micro-lens 317 is provided in the non-emission area NEA between the white and blue pixel regions W-SP and B-SP, the area of the opening of the bank 319 in the white pixel region W-SP is smaller than the area of the micro-lens 317 in the white pixel region W-SP. For example, since the micro-lens 317 in the green pixel region G-SP is provided in the emission area EA except the non-emission area NEA, the area of the opening of the bank 319 in the green pixel region G-SP is smaller than the area of the micro-lens 317 in the green pixel region G-SP.

The protection film 102 (of FIG. 2) as a thin film is formed on the emitting diode E such that the OLED device 300 is encapsulated by the protection film 102. In addition, a polarization plate 120 (of FIG. 2) can be disposed or attached on an outer side of the substrate 301 to prevent the ambient light reflection.

The emitting diode E emits white light. For example, the organic emitting layer 313 of the emitting diode E can include a first emission stack including a blue emitting material layer, a second emission stack including a yellow-green emitting material layer and a charge generation layer between the first and second emission stacks.

The red, blue and green color filters 306a, 306b and 306c, which respectively correspond to the red, blue and green pixel regions R-SP, B-SP and G-SP, are positioned between the emitting diode E and the substrate 301. Accordingly, the white light from the emitting diode E passes through the red, blue and green color filters 306a, 306b and 306c such that red light, blue light and green light are provided in the red, blue and green pixel regions R-SP, B-SP and G-SP, respectively. On the other hand, since there is no color filter in the white pixel region W-SP, the white light is provided in the white pixel region W-SP.

As explained with FIG. 3, the color temperature in the white pixel region W-SP is decreased by the micro-lens.

Figure 7A:
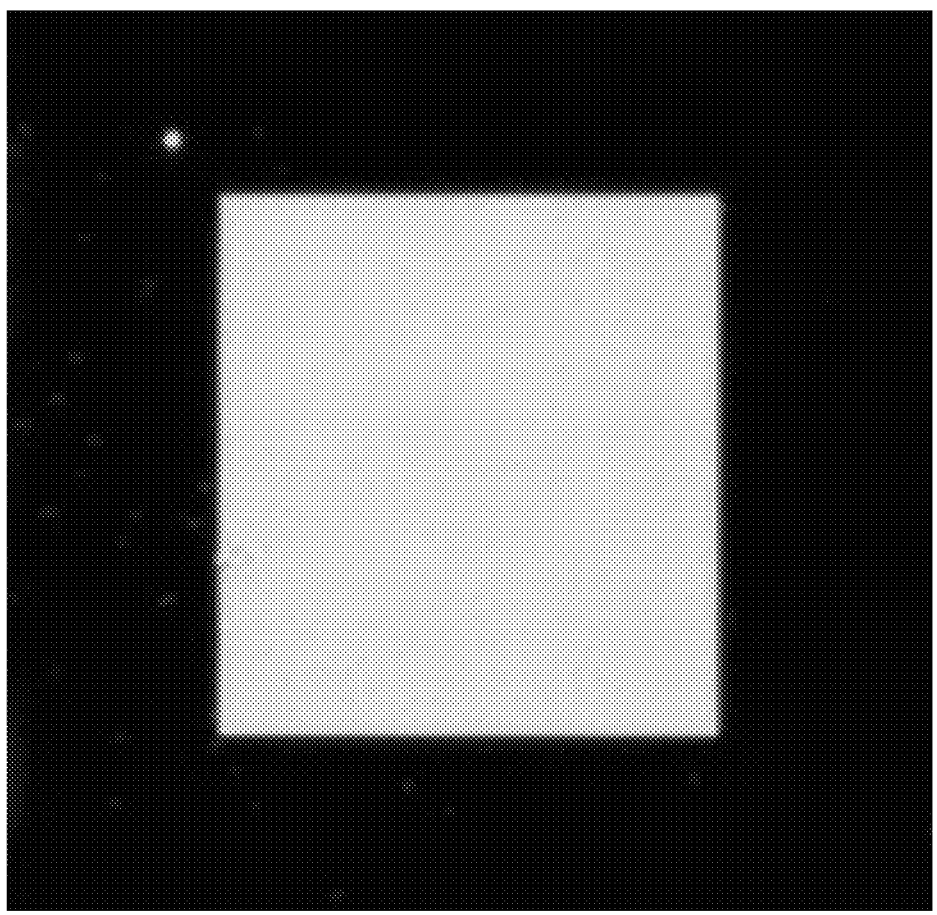
FIGS. 7A and 7B are pictures showing an emission state without and with a micro-lens, respectively.
Figure 7B:
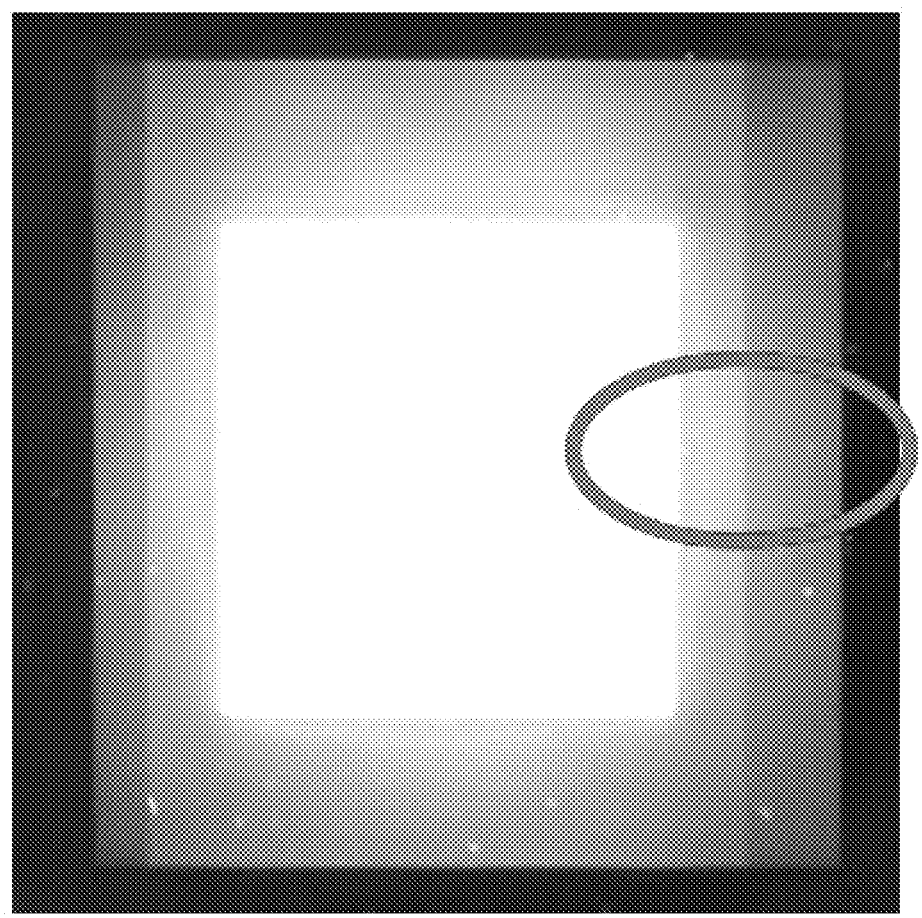

On the other hand, referring to FIGS. 7A and 7B, which are pictures showing an emission state without and with a micro-lens, respectively, the light is emitted in only emission area of the pixel region of the emitting diode without the micro-lens (see FIG. 7A), while the light blur is generated in the pixel region of the emitting diode with the micro-lens (see FIG. 7B).

As mentioned above, in the OLED device 300 of the present invention, the emitting efficiency is improved by the micro-lens 317. In addition, since the micro-lens 317 and the blue color filter pattern 300 is provided in the non-emission area NEA of the white pixel region W-SP and the blurred light passes through the blue color filter pattern 300, the light in the white pixel region W-SP is bluish. Namely, the light emitted from the emitting diode E in the white pixel region W-SP is incident into the blue color filter pattern 300 by the micro-lens 317 in the non-emission area NEA such that the bluish light passes through the substrate 301. In addition, the light from the emitting diode E in the white pixel region W-SP is reflected by the gate insulating layer 305 or the substrate 301 toward the micro-lens 317 in the non-emission area NEA, and the light is guided toward the blue color filter pattern 300 by the micro-lens 317 in the non-emission area NEA. As a result, the bluish light is provided on the substrate 301.

Accordingly, the decrease of the color temperature in the white pixel region W-SP by the micro-lens 317 is prevented or minimized.

For example, the micro-lens 317 in the green pixel region G-SP is formed in the emission area EA except the non-emission area NEA. When the micro-lens 317 in the green pixel region G-SP is formed the non-emission area NEA, the display quality is degraded.

On the other hand, the ambient light reflection is increased by the micro-lens. The amount (or intensity) of the ambient light reflection is different in each pixel region.

Figure 8:
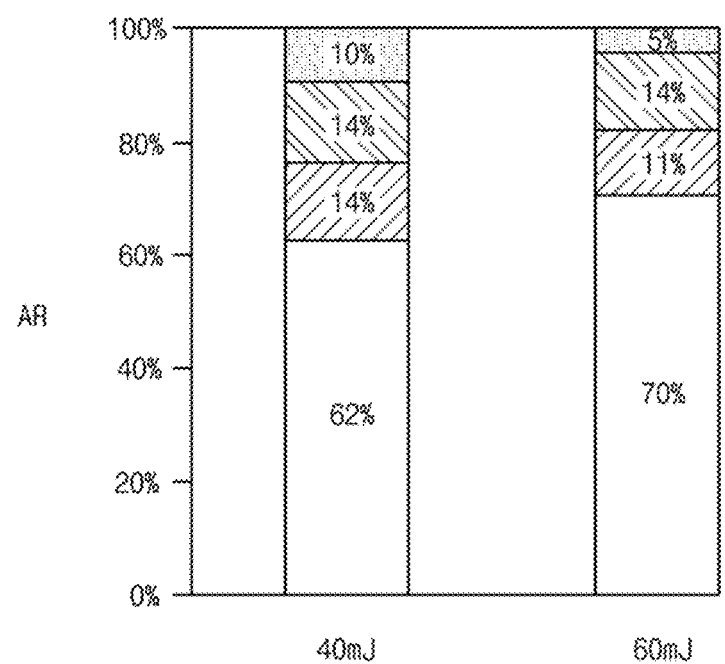
FIG. 8 is a graph illustrating a ratio of each pixel region in an ambient light reflection of an OLED device with a micro-lens.

Namely, referring to FIG. 8, which is a graph illustrating a ratio of each pixel region in an ambient light reflection of an OLED device with a micro-lens, the ratio of the ambient light reflection in each of the red and green pixel regions is smaller than that in the white pixel region and greater than blue pixel region. (The ratio is measured using DMS-803 apparatus.) Particularly, the reflection ratio (AR) in the white pixel region is very high. Namely, in the white pixel region without the color filter, the ambient light reflection by the micro-lens is significantly increased. The ambient light reflection is decreased by the blue color filter.

As mentioned above, in the OLED device 300, since the micro-lens 317 is provided in the non-emission area NEA between the white and blue pixel regions W-SP and B-SP as well as the emission area EA, the ambient light reflection by the micro-lens 317 can be strongly increased in the white pixel region W-SP. However, in the OLED device 300, since the blue color filter pattern 300 is provided in the non-emission area NEA between the white and blue pixel regions W-SP and B-SP, the increase of the ambient light reflection by the micro-lens 317 in the non-emission area NEA between the white and blue pixel regions W-SP and B-SP is minimized by the blue color filter pattern 300.

Accordingly, in the OLED device 300, the emitting efficiency is improved by the micro-lens 317. In addition, since the micro-lens 317 and the blue color filter pattern 300 is provided in the non-emission area NEA of the white pixel region W-SP, the decrease of the color temperature and the increase of the ambient light reflection by the micro-lens 317 is prevented or minimized.

Figure 9:
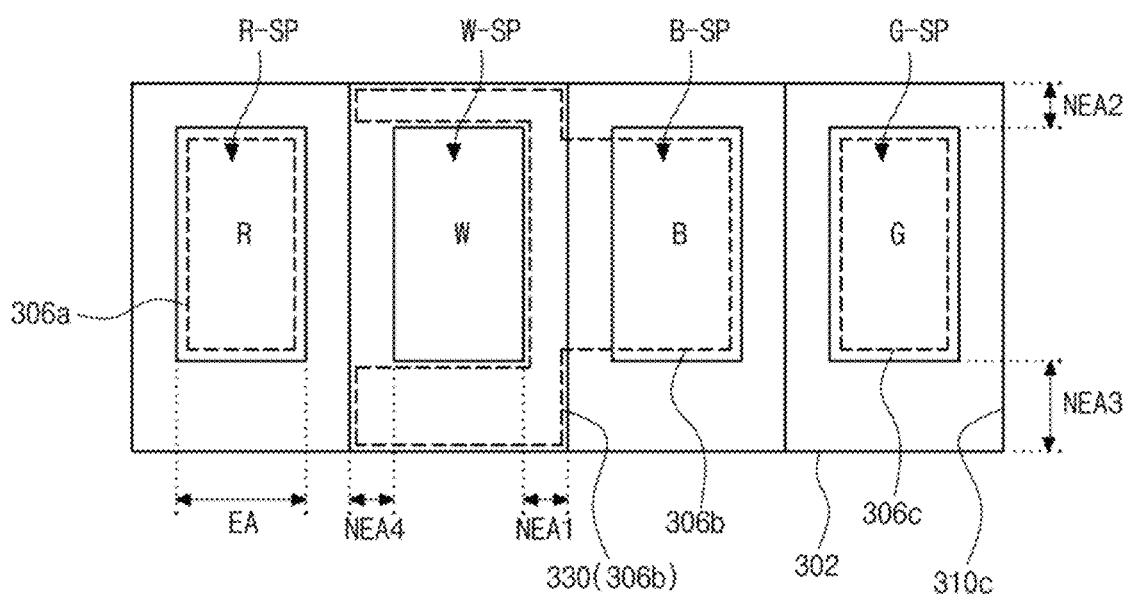
FIG. 9 is a schematic plan view of a pixel of an OLED device of a third embodiment of the present invention.

FIG. 9 is a schematic plan view of a pixel of an OLED device 300 of a third embodiment of the present invention.

As shown in FIG. 9, in the OLED device 300 according to the third embodiment of the present invention, the pixel includes the red, white, blue and green pixel regions R-SP, W-SP, B-SP and G-SP arranged along a first direction (horizontal direction).

The gate line 302 extending along the first direction and the data line 310c extending along a second direction cross each other to define the pixel regions R-SP, W-SP, B-SP and G-SP. The emission area EA the non-emission area NEA surrounding the emission area EA are provided in each of the pixel regions R-SP, W-SP, B-SP and G-SP.

In the white pixel region W-SP, the non-emission area NEA includes a first non-emission area NEA1, which is positioned between the white pixel region W-SP and the blue pixel region B-SP, a second non-emission area NEA2, which extends from the first non-emission area NEA1 toward an upper side of the first non-emission area NEA1, a third non-emission area NEA3, which extends from the first non-emission area NEA1 toward a lower side of the first non-emission area NEA1, and a fourth non-emission area NEA4, which connects the second and third non-emission areas NEA2 and NEA3. Namely, the fourth non-emission area NEA4 is positioned between the white pixel region W-SP and the red pixel region R-SP. Alternatively, when the green pixel region G-SP is adjacent to the white pixel region W-SP, the fourth non-emission area NEA4 is positioned between the white pixel region W-SP and the green pixel region G-SP. The blue color filter pattern 330 extends along the first direction (horizontal direction) from the blue color filter 306b toward the white pixel region W-SP. Alternatively, the blue color filter pattern 330 can be spaced apart from the blue color filter 306b by a predetermined distance.

The red, blue and green color filters 306a, 306b and 306c correspond to the red, blue and green pixel regions R-SP, B-SP and G-SP, respectively. In addition, the blue color filter pattern 330 is positioned in the first to third non-emission areas NEA1, NEA2 and NEA3 of the white pixel region W-SP.

Namely, unlike the OLED device according to the second embodiment shown in FIG. 5, the blue color filter pattern 330 in the OLED device according to the third embodiment corresponds to three sides of the white pixel region W-SP.

Alternatively, the blue color filter pattern 330 in the second non-emission area NEA2 or the third non-emission area NEA3 can be omitted, or the blue color filter pattern 330 can be formed in all of the first to fourth non-emission areas NEA1 to NEA4. Namely, the blue color filter pattern 330 can correspond to at least two sides of the emission area EA in the white pixel region W-SP.

The OLED device 300 includes the micro-lens 317 (of FIG. 6), and the micro-lens 317 extends into the first to third non-emission areas NEA1 to NEA3. Accordingly, the micro-lens 317 in the white pixel region W-SP corresponds (overlaps) the blue color filter pattern 330.

As mentioned above, in the OLED device 300, the emitting efficiency is improved by the micro-lens 317. In addition, since the micro-lens 317 and the blue color filter pattern 300 is provided in the non-emission area NEA of the white pixel region W-SP, the decrease of the color temperature and the increase of the ambient light reflection by the micro-lens 317 is prevented or minimized.

Figure 10:
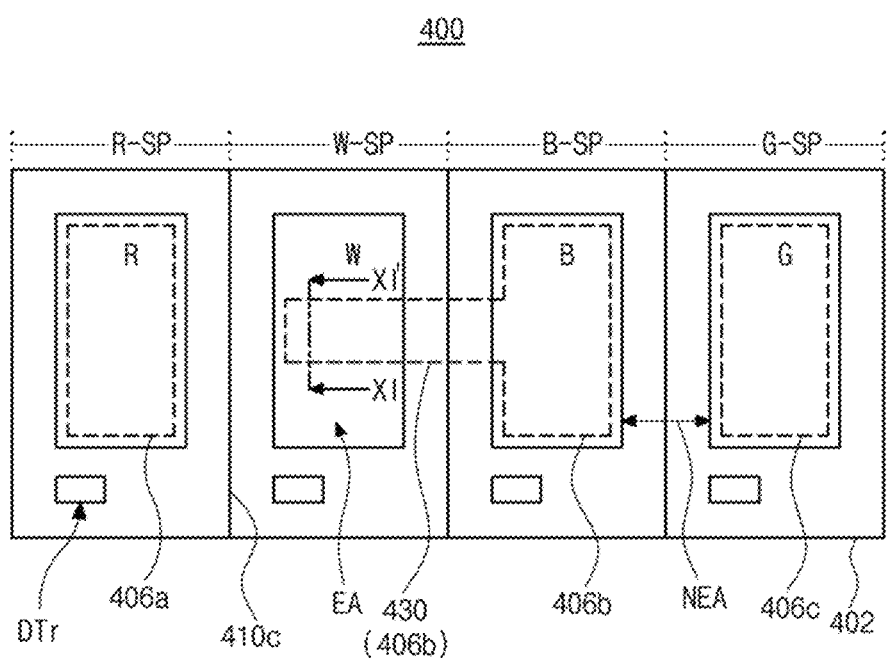
FIG. 10 is a schematic plan view of a pixel of an OLED device of a fourth embodiment of the present invention.
Figure 11:
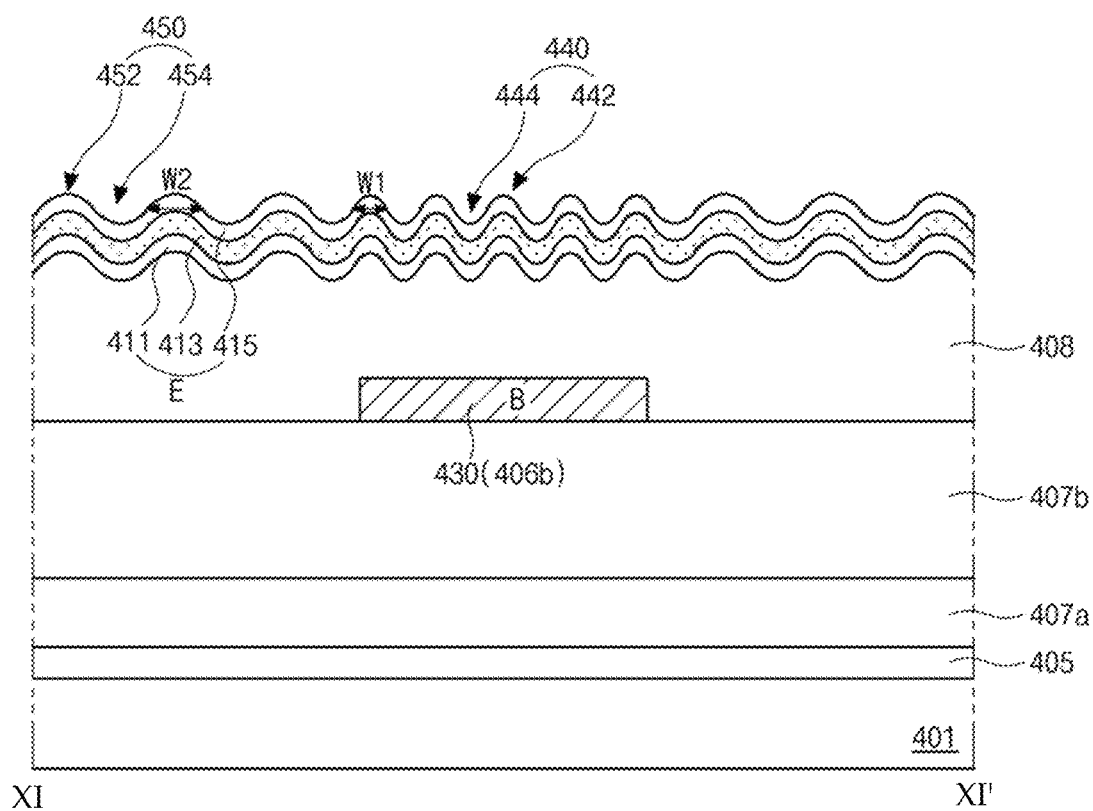
FIG. 11 is a schematic cross-sectional view taken along the line XI-XI' of FIG. 10.

FIG. 10 is a schematic plan view of a pixel of an OLED device 400 of a fourth embodiment of the present invention, and FIG. 11 is a schematic cross-sectional view taken along the line XI-XI' of FIG. 10.

As shown in FIGS. 10 and 11, in the OLED device 400 according to the fourth embodiment of the present invention, the pixel includes the red, white, blue and green pixel regions R-SP, W-SP, B-SP and G-SP arranged along a first direction (horizontal direction).

Each of the pixel regions R-SP, W-SP, B-SP and G-SP includes the non-emission area NEA, where the bank 319 (of FIG. 6) is disposed, and the emission area EA surrounded by the non-emission area NEA. The emitting diode E, which includes the first electrode 411, the organic emitting layer 413 and the second electrode 415, is formed in the emission area EA.

The driving TFT DTr is disposed in the non-emission area NEA of each of the pixel regions R-SP, W-SP, B-SP and G-SP. For example, the driving TFT DTr includes the semiconductor layer, the gate electrode, the source electrode and the drain electrode.

Referring to FIG. 2 with FIGS. 10 and 11, the semiconductor layer 103 is formed on the substrate 401, and the gate insulating layer 305 covering the semiconductor layer 103 is formed on an entire surface of the substrate 401. The gate electrode 107 overlapping the semiconductor layer 103 is formed on the gate insulating layer 405, and the first interlayer insulating layer 407a is formed on the gate electrode 107. The source electrode 110a and the drain electrode 110b, which are spaced apart from each other and respectively contact the both sides, i.e., the source region 103b and the drain region 103c, of the semiconductor layer 103, are formed on the first interlayer insulating layer 407a.

In addition, the gate line 402 extending along a first direction is formed on the gate insulating layer 405, and the data line 410c extending a second direction is formed on the first interlayer insulating layer 407a. The gate line 402 and the data line 410c cross each other to define each of the pixel regions R-SP, W-SP, B-SP and G-SP.

The second interlayer insulating layer 407b is formed on the data line 410c, and the red, blue and green color filters 406a, 406b and 406c are formed on the second interlayer insulating layer 407b. The red, blue and green color filters 406a, 406b and 406c correspond to the red, blue and green pixel regions R-SP, B-SP and G-SP, respectively. In addition, a blue color filter pattern 430 is formed on the second insulating layer 407b and in a part of the white pixel region W-SP. The blue color filter pattern 430 is positioned at a center of the white pixel region W-SP. In FIG. 10, the blue color filter pattern 430 extends from the blue color filter 406b toward the white pixel region W-SP along the first direction, i.e., a horizontal direction. Alternatively, the blue color filter pattern 430 can be spaced apart from the blue color filter 406b by a predetermined distance.

The second interlayer insulating layer 407b can be omitted. In this instance, the red, blue and green color filters 406a, 406b and 406c and the blue color filter pattern 430 can be formed on the first interlayer insulating layer 407a The overcoat layer 408 is formed to cover the red, blue and green color filters 406a, 406b and 406c and the blue color filter pattern 430. The overcoat layer 408 has an uneven surface. Namely, the plurality of concave portions 444 and 454 and the plurality of convex portions 442 and 452 are alternately provided at a surface of the overcoat layer 408 such that the overcoat layer 408 includes a first micro-lens 440 and a second micro-lens 450. In the white pixel region W-SP, the first micro-lens 440 corresponds to the blue color filter pattern 430, and the second micro-lens 450 corresponds to a rest region of the emission area EA except the blue color filter pattern 430.

The overcoat layer 408 is formed of an insulating material having a refractive index of about 1.5. For example, the overcoat layer 408 can be formed of an acryl-based resin, an epoxy-based resin, a phenol-based resin, a polyamide-based resin, a polyimide-based resin, a unsaturated-polyester-based resin, a polyphenylene-based resin, a polyphenylene-sulfide-based resin, a benzocyclobutene-based resin or photoresist, but it is not limited thereto.

The indent portion 108a (of FIG. 4) corresponding to the non-emission area NEA can be formed through the overcoat layer 408. In this instance, in the indent portion 108a between the blue pixel region B-Spa and the white pixel region W-SP, the second electrode 415 can be positioned between the blue color filter 406b in the blue pixel region B-SP and the blue color filter pattern 430 in the white pixel region W-SP.

The first electrode 411 is disposed on the overcoat layer 408 in each of the pixel regions R-SP, W-SP, B-SP and G-SP. The first electrode 411 is connected to the driving TFT DTr through the drain contact hole 117 (of FIG. 2). The first electrode 411 can be formed of a conductive material having a relatively high work function to serve as an anode.

The bank 319 is disposed in the non-emission area NEA and covers the edge of the first electrode 411. Namely, the bank 319 has an opening a portion of the first electrode 411, and the opening corresponds to each of the pixel regions R-SP, W-SP, B-SP and G-SP. In other words, the bank 419 surrounds the emission area EA and is disposed on the overcoat layer 408.

The organic emitting layer 413 is formed to cover the bank 319 and the first electrode 411. Namely, the organic emitting layer 413 contacts the first electrode 413 in the emission area EA and the bank 319 in the non-emission area NEA.

The organic emitting layer 413 is formed on an entire surface of the display area including the red, white, blue and green pixel regions R-SP, W-SP, B-SP and G-SP.

The second electrode 415 is formed on the organic emitting layer 413. The second electrode 415 can be formed of a conductive material having a relatively low work function to serve as a cathode.

The first and second electrodes 411 and 415 facing each other and the organic emitting layer 413 therebetween constitute the emitting diode E.

In the emission are EA, the first and second micro-lenses 440 and 450 are provided on the first electrode 411, the organic emitting layer 413 and the second electrode 415 by the concave portions 444 and 454 and the convex portions 442 and 452 on the overcoat layer 408.

As mentioned above, in the white pixel region W-SP, the first micro-lens 440 corresponds to the blue color filter pattern 430, and the second micro-lens 450 corresponds to a rest region of the emission area EA except the blue color filter pattern 430.

The protection film 102 (of FIG. 2) as a thin film is formed on the emitting diode E such that the OLED device 400 is encapsulated by the protection film 102. In addition, a polarization plate 120 (of FIG. 2) can be disposed or attached on an outer side of the substrate 401 to prevent the ambient light reflection.

The emitting diode E emits white light. For example, the organic emitting layer 413 of the emitting diode E can include a first emission stack including a blue emitting material layer, a second emission stack including a yellow-green emitting material layer and a charge generation layer between the first and second emission stacks.

The red, blue and green color filters 406a, 406b and 406c, which respectively correspond to the red, blue and green pixel regions R-SP, B-SP and G-SP, are positioned between the emitting diode E and the substrate 401. Accordingly, the white light from the emitting diode E passes through the red, blue and green color filters 406a, 406b and 406c such that red light, blue light and green light are provided in the red, blue and green pixel regions R-SP, B-SP and G-SP, respectively.

As mentioned above, the micro-lenses 440 and 450 are provided in the emitting diode E and the overcoat layer 408 such that the emitting efficiency of the OLED device 400 is improved.

However, the improvement of the emitting efficiency by the micro-lenses 440 and 450 is strongly generated in the yellow-green light other than the blue light.

Namely, as explained with FIG. 6, in comparison to the emitting diode "Ref" without the micro-lens, the light intensity, i.e., the luminance or the brightness, of the emitting diode "MLA" with the micro-lens is increased. In this instance, the luminance increase of the yellow-green light is greater than that of the blue light such that the color temperature in the white pixel region W-SP is decreased.

However, in the OLED device 400 of the present invention, since the blue color filter pattern 430 is provided in a part of the emission area EA in the blue pixel region W-SP, the decrease of the color temperature by the micro-lenses 440 and 450 is compensated.

In addition, since the blue color filter pattern 430 is positioned at a center of the white pixel region W-SP, the area of the blue color filter pattern 430 in the emission area EA of the white pixel region W-SP is secured even when the mis-align problem is generated. Accordingly, the uniformity of the color temperature increase by the blue color filter pattern 430 is secured.

For example, referring to FIG. 9, when the blue color filter pattern 330 is formed in the second and third non-emission areas NEA2 and NEA3 and the mis-align is generated along the vertical direction, the area of the blue color filter pattern 330 in the white pixel region W-SP is changed such that desired color temperature cannot be provided.

However, in the OLED device 400, since the blue color filter pattern 430 is positioned at a center of the white pixel region W-SP, the area of the blue color filter pattern 430 in the emission area EA of the white pixel region W-SP is secured such that the increase of the color temperature by the blue color filter pattern 430 is uniformed.

Figure 12:
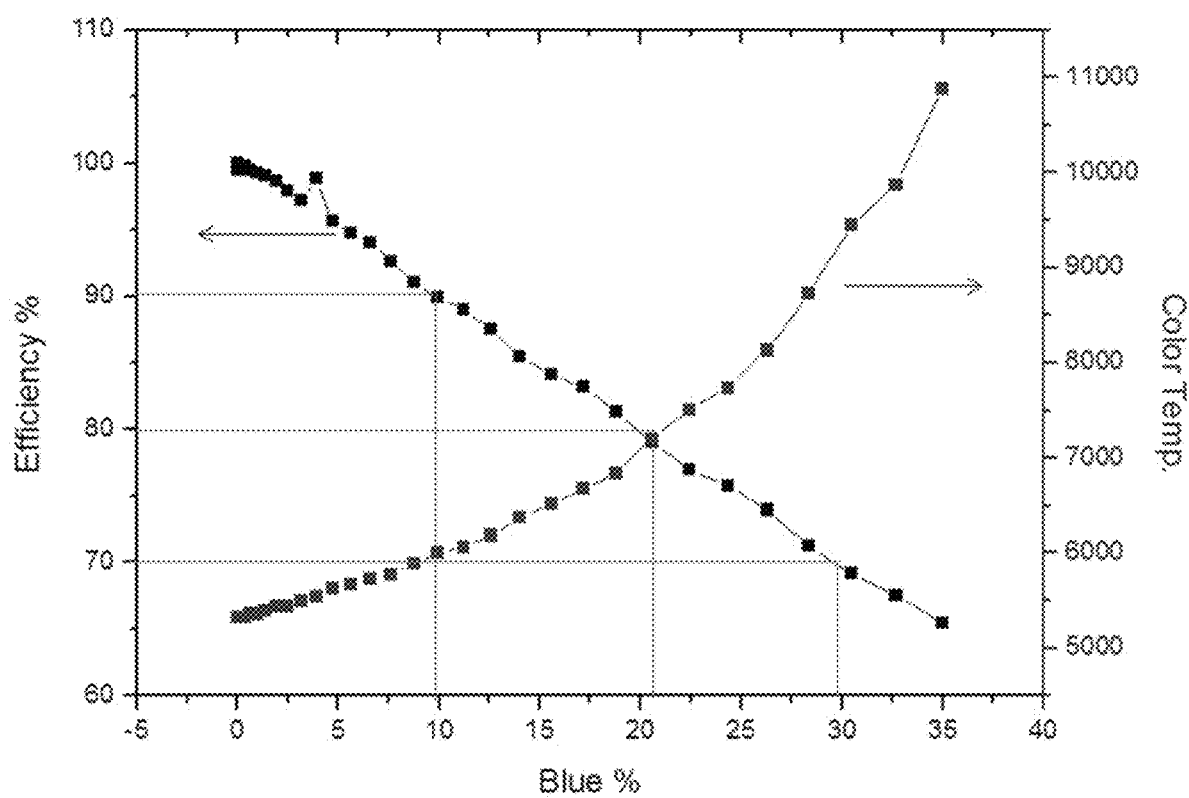
FIG. 12 is a graph illustrating changes of brightness and color temperature by a blue color filter pattern in a white pixel region.

On the other hand, the brightness and the color temperature are changed by the area ratio of the blue color filter pattern 430 to the white pixel region W-SP. Referring to FIG. 12, which is a graph illustrating changes of brightness and color temperature by a blue color filter pattern in a white pixel region, when the area ratio "Blue %" of the blue color filter pattern 430 to the emission area EA of the white pixel region W-SP in increased, the emitting efficiency of the white pixel region W-SP is decreased. Namely, when the area of the blue color filter pattern 430 is increased, the brightness is decreased. On the other hand, when the area ratio "Blue %" of the blue color filter pattern 430 to the emission area EA of the white pixel region W-SP in increased, the color temperature is increased. Namely, the brightness and the color temperature by the blue color filter pattern 430 in the emission area EA of the white pixel region W-SP has a trade-off relation.

On the other hand, the ambient light reflection and the emitting efficiency are changed by an aspect ratio of the convex portion of the micro-lens. Namely, when the aspect ratio of the convex portion of the micro-lens is relatively high, the ambient light reflection and the emitting efficiency, i.e., the out-coupling efficiency by the micro-lens, are increased.

In addition, since the ambient light reflection is alleviated by the color filter, the ambient light reflection is strongly generated in the white pixel region W-SP.

In the OLED device 400, the first and second micro-lenses 440 and 450 are provided in the white pixel region W-SP, and a first width w1 of the convex portion 442 of the first micro-lens 440, which corresponds to the blue color filter pattern 430, is smaller than a second width w2 of the convex portion 452 of the second micro-lens 450. In this instance, the convex portion 442 of the first micro-lens 440 and the convex portion 452 of the second micro-lens 450 have the same height. In other words, the aspect ratio (=height/width) of the first micro-lens 440, i.e., the aspect ratio of the convex portion 442, is greater than that of the second micro-lens 450.

In FIG. 11, the first and second micro-lenses 440 and 450 have the same height and different pitches. Alternatively, the first and second micro-lenses 440 and 450 can have the same pitch and different heights. In this instance, the first micro-lens 440 can have the height being greater than that of the second micro-lens 450.

Accordingly, the ambient light reflection and the out-coupling efficiency are increased in the first micro-lens 440 and decreased in the second micro-lens 450.

Since the blue color filer pattern 430 is formed to correspond to the first micro-lens 440 in the white pixel region W-SP, the ambient light reflection is blocked by the blue color filter pattern 430 even when the ambient light reflection is increased by the first micro-lens 440. Accordingly, there is no increase of the ambient light reflection by the first micro-lens 440 in the white pixel region W-SP.

On the other hand, in the rest region of the emission area EA in the white pixel region W-SP, where the blue color filter pattern 430 is not formed, the pitch of the second micro-lens 450 is increased such that the ambient light reflection is decreased.

Accordingly, in the OLED device 400, the ambient light reflection is minimized, and the color temperature in the white pixel region W-SP is increase or maximized. In addition, the brightness decrease by the blue color filter pattern 430 is prevented.

Alternatively, the first and second micro-lenses 440 and 450 can have the same aspect ratio.

On the other hand, in the OLED device 300 in FIGS. 4 and 9, the pitch of the micro-lens 317 corresponding to the blue color filter pattern 330 can be smaller than the pitch of the micro-lens 317 in the emission area EA of the white pixel region W-SP.

It will be apparent to those skilled in the art that various modifications and variations can be made in the embodiments of the invention without departing from the spirit or scope of the invention. Thus, it is intended that the modifications and variations cover this invention provided they come within the scope of the appended claims and their equivalents.

What is claimed is:

1. An organic light emitting display device, comprising:
   a substrate including a white pixel region;
   a blue color filter pattern in a first region of the white pixel region;
   an overcoat layer covering the blue color filer pattern and including a micro-lens;
   a first electrode on the overcoat layer;
   an organic emitting layer covering the first electrode; and
   a second electrode covering the organic emitting layer.

2. The organic light emitting display device according to claim 1, wherein the white pixel region includes an emission area and a non-emission area at a periphery of the emission area, and the first region corresponds to the non-emission area.

3. The organic light emitting display device according to claim 2, wherein the substrate further includes a first pixel region adjacent to the white pixel region along a first direction, and
   wherein the organic light emitting display device further includes a first color filter in an emission area of the first pixel region.

4. The organic light emitting display device according to claim 3, wherein the overcoat layer includes an indent portion in the non-emission area between the white pixel region and the first pixel region, and the second electrode is positioned in the indent portion.

5. The organic light emitting display device according to claim 4, further comprising:
   a bank disposed in the non-emission area and covering an edge of the first electrode,
   wherein the bank exposes the indent portion.

6. The organic light emitting display device according to claim 4, wherein the second electrode in the indent portion is positioned between the first color filter and the blue color filter pattern.

7. The organic light emitting display device according to claim 6, wherein the first pixel region is a red pixel region, and the first color filter is a red color filter.

8. The organic light emitting display device according to claim 4, further comprising:
   a metal line disposed between the substrate and the overcoat layer,
   wherein the metal line overlaps the indent portion.

9. The organic light emitting display device according to claim 3, wherein the first pixel region is a blue pixel region, and the first color filter is a blue color filter, and
   wherein the blue color filter pattern extends from the first color filter.

10. The organic light emitting display device according to claim 9, wherein the micro-lens is provided in the non-emission area between the white pixel region and the first pixel region and overlaps the blue color filter pattern.

11. The organic light emitting display device according to claim 10, wherein the micro-lens has a first aspect ratio in the non-emission area of the white pixel region and a second aspect ratio in the emission area of the white pixel region, and
   wherein the first aspect ratio is greater than the second aspect ratio.

12. The organic light emitting display device according to claim 9, wherein the blue color filter pattern corresponds to at least two sides of the emission area of the white pixel region.

13. The organic light emitting display device according to claim 9, wherein the substrate further includes a second pixel region adjacent to the white pixel region and opposite to the first pixel region, and
   wherein the micro-lens in the second pixel region corresponds to the emission area of the second pixel region, and the micro-lens in the white pixel region corresponds to the emission area and the non-emission area of the white pixel region.

14. The organic light emitting display device according to claim 13, further comprising:
   a bank disposed in the non-emission area and having an opening in correspondence to the emission area.

15. The organic light emitting display device according to claim 14, wherein in the second pixel region, an area of the opening is substantially equal to an area of the micro-lens, and in the white pixel region, the area of the opening is smaller than the area of the micro-lens.

16. The organic light emitting display device according to claim 14, wherein the bank includes an uneven surface in the non-emission area between the white pixel region and the first pixel region, and a flat surface in a non-emission area between the first and second pixel regions.

17. The organic light emitting display device according to claim 13, wherein at least one of the overcoat layer, the organic emitting layer and the second electrode includes an uneven surface in the non-emission area between the white pixel region and the first pixel region, and a flat surface in a non-emission area between the first and second pixel regions.

18. The organic light emitting display device according to claim 1, wherein the micro-lens has a first aspect ratio in the first region and a second aspect ratio in a second region of the white pixel region except the first region.

19. The organic light emitting display device according to claim 1, wherein the first region runs across the white pixel region.

20. The organic light emitting display device according to claim 19, further comprising:
   a blue color filter in a second pixel region adjacent to the white pixel region,
   wherein the blue color filter pattern extends from the blue color filter.

* * * * *